(12) United States Patent
Soer et al.

(10) Patent No.: US 12,033,990 B2
(45) Date of Patent: Jul. 9, 2024

(54) MULTI-COLOR PHOSPHOR CONVERTED LED PACKAGE WITH SINGLE CAVITY

(71) Applicant: Lumileds LLC, San Jose, CA (US)

(72) Inventors: Wouter Soer, Utrecht (NL); Gregory Tashjian, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 8 days.

(21) Appl. No.: 17/846,616

(22) Filed: Jun. 22, 2022

(65) Prior Publication Data

US 2022/0328462 A1 Oct. 13, 2022

Related U.S. Application Data

(63) Continuation of application No. 16/714,238, filed on Dec. 13, 2019, now Pat. No. 11,398,458.

(51) Int. Cl.
 *H01L 25/075* (2006.01)
(52) U.S. Cl.
 CPC ................. *H01L 25/0753* (2013.01)
(58) Field of Classification Search
 CPC ............ H01L 25/0753; H01L 33/504; H01L 33/0004–648; H01L 25/18; H01L 2933/0091; H01L 2933/0041
 See application file for complete search history.

(56) References Cited

U.S. PATENT DOCUMENTS 8,288,935 B2 * 10/2012 Su .................. H01L 25/0753
 313/499
8,704,244 B2 4/2014 Suzuki et al.
10,158,052 B2 12/2018 Weiler et al.
10,588,184 B2 3/2020 Tseng et al.
11,398,458 B2 7/2022 Soer et al.
2010/0025700 A1 2/2010 Jung et al.
2010/0090231 A1 4/2010 Jung et al.
2011/0273079 A1 11/2011 Pickard et al.
2011/0278606 A1 11/2011 Suzuki et al.
2013/0242607 A1 9/2013 Lai et al.
(Continued)

FOREIGN PATENT DOCUMENTS

CN 102308398 A 1/2012
CN 105423149 A 3/2016
(Continued)

OTHER PUBLICATIONS

Extended European Search Report, EP Application No. 20159990.9, dated Jul. 24, 2020, 11 pages.
(Continued)

*Primary Examiner* — Cuong B Nguyen

(57) ABSTRACT

A lighting device includes a first LED configured to emit a first light, a second LED configured to emit a third light, a first phosphor disposed over the first LED and second LED, and arranged to absorb a portion of the first light and in response emit a second light of a longer wavelength than the first light, and a second phosphor disposed over the second LED, the second phosphor arranged to absorb a portion of the third light and in response emit a fourth light of a longer wavelength than the third light, and the fourth light exits the second phosphor into the first phosphor, and both the second light and fourth light exit the lighting device though the first phosphor.

13 Claims, 7 Drawing Sheets

(56) References Cited

U.S. PATENT DOCUMENTS

| | | |
|---|---|---|
| 2018/0315902 A1 | 11/2018 | Zhang et al. |
| 2019/0013446 A1 | 1/2019 | Byun et al. |
| 2019/0165222 A1 | 5/2019 | Bando et al. |
| 2020/0411733 A1 | 12/2020 | Byun et al. |

FOREIGN PATENT DOCUMENTS

| | | |
|---|---|---|
| DE | 102016124873 A1 | 6/2018 |
| EP | 2843702 A1 | 3/2015 |
| EP | 3358241 A1 | 8/2018 |
| JP | 2019102796 A | 6/2019 |
| KR | 10-2015-0082426 A | 7/2015 |
| KR | 20170077679 A | 7/2017 |
| KR | 10-2018-0040508 A | 4/2018 |
| WO | 2012121304 A1 | 9/2012 |

OTHER PUBLICATIONS

From the EPO as the ISA, "Notification of he International Search Report and the Written Opinion of the International Searching Authority, or the Declaration", PCT/US2020/064568, dated Mar. 12, 2021, 18 pages.

\* cited by examiner

MULTI-COLOR PHOSPHOR CONVERTED LED PACKAGE WITH SINGLE CAVITY

CROSS REFERENCE TO RELATED APPLICATIONS

This application is a continuation of U.S. patent application Ser. No. 16/714,238 filed Dec. 13, 2019, which is incorporated herein by reference in its entirety.

FIELD OF THE INVENTION

This disclosure generally relates to lighting devices using combinations of phosphors and light emitting diodes to create a uniform source appearance.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphors may be embedded in a silicone matrix that is disposed in the path of light emitted by the LED.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties A color point is a point in a chromaticity diagram characterizing a particular spectrum of light as a color perceived by a human with normal color vision. A correlated color temperature ("CCT") is the temperature corresponding to the point on the blackbody curve in a chromaticity diagram to which a color point is most closely correlated.

SUMMARY

In one aspect a lighting device is disclosed, the lighting device including a first LED configured to emit a first light, a second LED configured to emit a third light, a first phosphor disposed over the first LED and second LED, and arranged to absorb a portion of the first light and in response emit a second light of a longer wavelength than the first light, and a second phosphor disposed over the second LED, the second phosphor arranged to absorb a portion of the third light and in response emit a fourth light of a longer wavelength than the third light, and the fourth light exits the second phosphor into the first phosphor, and both the second light and fourth light exit the lighting device though the first phosphor.

The first phosphor may include a light emitting surface opposite the second LED, the first phosphor, and the first LED, and the second light, fourth light, an unconverted portion of the first light, and an unconverted portion of the third light may pass through the light emitting surface.

The portion of third light absorbed by the second phosphor may be greater than the portion of first light absorbed by the first phosphor.

The first light may have a first wavelength range, a first spectral power distribution of the second light and unconverted first light may have at least 25% of total radiant power within the first wavelength range, and a second spectral power distribution of the fourth light and unconverted third light may have less than 3% of total radiant power in the first wavelength range.

The lighting device may further include a third LED configured to emit a fifth light, and a third phosphor disposed over the third LED and arranged to absorb the fifth light and emit a sixth light, where the sixth light exits the third phosphor into the first phosphor and exits the lighting device through the first phosphor.

The first light, the second light, and the fifth light may each be blue light having a wavelength range of 400-460 nm, the second phosphor may be a red phosphor, and the third phosphor may be a green phosphor.

The first LED, second LED, and third LED may all be mounted within a single lead frame on a mounting surface, the first phosphor comprising a light emitting surface opposite the mounting surface.

Substantially all of the light emitted by the first LED and the second LED that exits the lighting device may pass through the first phosphor.

In another aspect, a lighting device includes a first LED, a second LED, a first phosphor disposed over the first LED and second LED; and a second phosphor disposed over the second LED, between the second LED and the first phosphor, and between the second LED and the first LED.

The first phosphor may include a light emitting surface opposite the second LED, the first phosphor, and the first LED.

The first phosphor may be in direct contact with the first LED and the second phosphor.

The first phosphor may include a light emitting surface, a first light emitted by the first LED enters the first phosphor from the first LED and exits the first phosphor from the light emitting surface, and a second light emitted by the second LED enters the second phosphor from the second LED, exits the second phosphor into the first phosphor, and exits the first phosphor through the light emitting surface.

The first phosphor may include a first phosphor material mixed into a first carrier material and the second phosphor may include a second phosphor material mixed into a second carrier material, and a concentration of second phosphor in second carrier material is higher than a concentration of first phosphor in first carrier material.

The first and second carrier materials may be silicone.

The first LED and second LED may both be mounted within a single lead frame on a mounting surface, the first phosphor having a light emitting surface opposite the mounting surface.

The mounting surface may include a barrier surrounding the second LED and the second phosphor is contained within the barrier.

The lighting device may further include a third LED and a third phosphor, the third phosphor disposed over the third LED, between the first phosphor and the third LED, and between the third LED and the first LED, the first phosphor disposed between the second phosphor and the third phosphor.

The first LED, second LED, and third LED may be semiconductor diode structures configured to emit blue light having a wavelength in the range of 400-460 nm, the second phosphor may be configured to absorbs blue light and emit green light, and the third phosphor may be configured to absorb blue light and emit red light.

The first LED, second LED, and third LED may all be mounted within a single lead frame on a mounting surface, the first phosphor may include a light emitting surface opposite the mounting surface.

The first LED may include a first plurality of semiconductor diode structures and the second LED comprises a second plurality of semiconductor diode structures.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

A particular color or white light CCT value of light from a single lighting device can be achieved by means of mixing two or more different colors of light that are emitted from two or more differently colored light sources. Using two or more differently colored light sources (which may be referred to as "primaries") in a lighting device is particularly useful for a tunable lighting device. In such tunable lighting devices, the color or white light CCT value of the emitted light can be adjusted by varying the amount of light output by the differently colored light sources, or primaries, to achieve varying colors or white light CCT values of the overall emitted light from the lighting device. For instance, color tuning with desaturated red, green, and blue pcLED primaries (as used, for example, in Lumileds Holdings B.V.'s LUXEON Fusion® lighting devices) is an effective approach to achieving high efficacy and flux of white light over a wide CCT range while also providing high color fidelity.

The light sources, or primaries, used in such color tunable and white light CCT tunable lighting devices are typically implemented as discrete LED packages. Thus, two or more discrete LED packages, each emitting a different color of light, are combined to form the tunable lighting device. For example, a white light CCT tunable lighting device may include two discrete LED packages, which may be standard white LED packages, one having a CCT value of 2700K and the other having a CCT value of 6500K.

Combining discrete LED packages can, however, cause a large degree of color variation on the total light emitting surface ("LES") of the lighting device. This large degree of color variation can be a disadvantage in various optical designs. In directional lighting, color variation of the LES may be visible in the far field, and use of specifically designed secondary optics are required to provide color mixing and reduce color variation. The use of such secondary optics can cause optical efficiency losses and/or an increase in size and volume of the lighting device. In non-directional lighting, it is often desirable for the lighting device to have a uniform appearance, which is typically achieved by use of optical diffusers. As the color variation increases, however, a larger mixing distance and/or stronger optical diffusers, which increase light loss, are needed to achieve a uniform appearance.

Figure 1A:
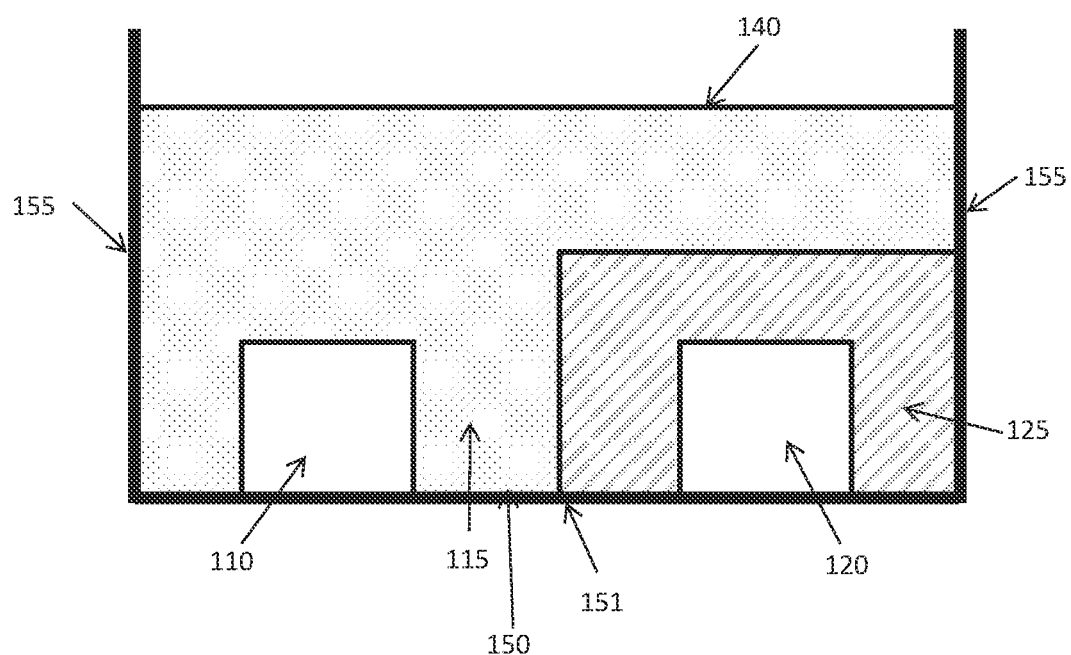
FIG. 1A and FIG. 1B are cross-sectional views illustrating a lighting device according to an example embodiment.

FIG. 1A illustrates an example embodiment of a lighting device that combines two or more primaries and achieves a uniform appearance of light. The lighting device 100 of FIG. 1A includes a first LED 110 and a second LED 120. First LED 110 and second LED 120 may be mounted on a mounting surface 150 of, for instance, a base 151. A first phosphor 115 is disposed over both the first LED 110 and the second LED 120. A second phosphor 125 is disposed over only the second LED 120, such that the second phosphor is disposed between the first phosphor 115 and the second LED 120, and is also disposed between the first LED 110 and the second LED 120. As show in FIG. 1A, the second phosphor 125 may be in contact with the first phosphor 115.

Lighting device 100 may include sidewalls 155, which may surround the lighting device 100. The base 151 and side walls 155 may be formed by a single lead frame. First LED 110 and second LED 120 are mounted within the single lead frame on the mounting surface 150 of base 151. The first LED and second LED may be connected to a power source through the lead frame as is understood by a person having ordinary skill in the art. The first LED and second LED may have a common anode, common cathode or each have an individually addressable anode and cathode.

The first phosphor 115 forms a light emitting surface 140 on lighting device 100 that is opposite to the first LED 110 and second LED 125, and opposite to the mounting surface 150. The entire light emitting surface may be formed from an optically uniform material composed of the first phosphor 115. The light emitting surface 140 may be continuous, unbroken, and regular across the entire surface. The light emitting surface 140 may be substantially flat. The light emitting surface 140 may entirely fill an area contained within sidewalls 151, for instance, within a lead frame package. The light emitting surface 140 is the surface through which light output by the first LED 110 and second LED 120 exits the lighting device 100, creating a uniform source appearance due to the scattering properties of the first phosphor 115.

Figure 1B:
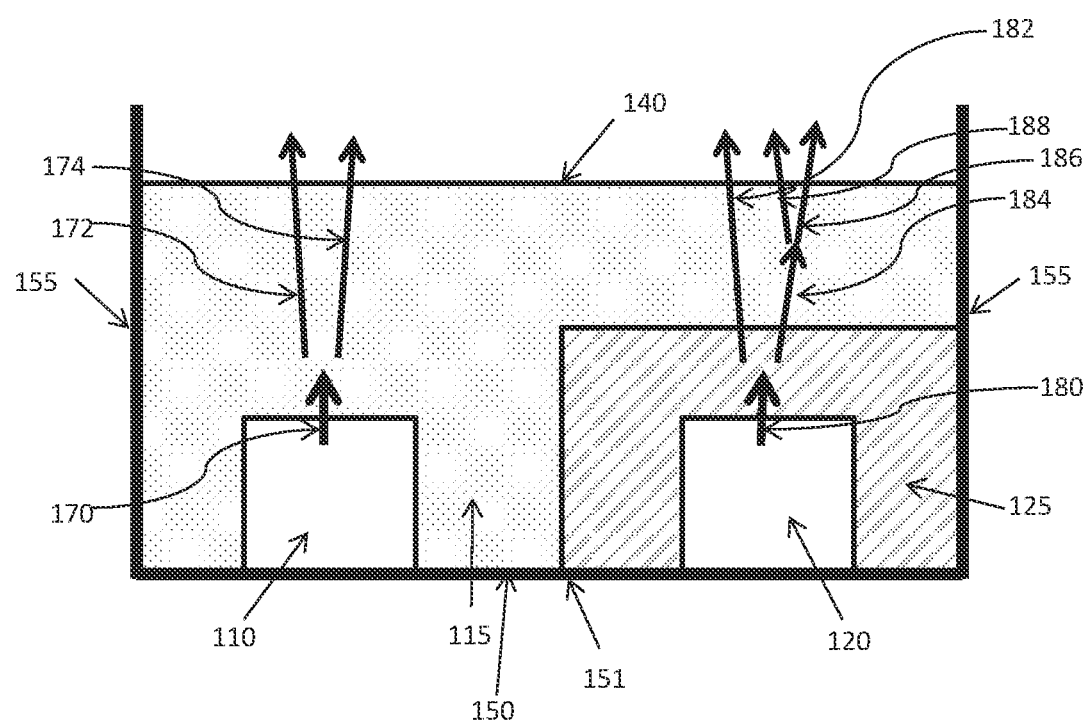

FIG. 1B illustrates the light path through lighting device 100. First LED 110 is configured to emit a first light 170 which enters the first phosphor 115. At least a portion of first light 170 is absorbed by first phosphor 115, which down-converts the portion of first light 170 to a second light 172. Second light 172 has longer wavelengths than first light 170. Second light 172 exits lighting device 100 through the light emitting surface 140.

First phosphor 115 may be formed such that a portion of first light 170 emitted from the first LED enters the first phosphor 115 and is not down-converted by phosphor 115. The unconverted first light 174 passes through the first phosphor 115 and exits the light emitting surface 140 having the same range of wavelengths as the first light 170.

Second LED 120 is configured to emit a third light 180, which enters the second phosphor 125. At least a portion of third light 180 is absorbed by the second phosphor 125, which down-converts the portion of third light 180 to a fourth light 182. Fourth light 182 has longer wavelengths than third light 180. Fourth light 182 enters the first phosphor 115 from the second phosphor 125.

The first phosphor 115 and second phosphor 125 may be chosen so that the fourth light 182 is not absorbed by the first phosphor 115, in which case fourth light 182 passes through the first phosphor 115 and exits lighting device 100 through the light emitting surface 140.

Second phosphor 125 may be formed such that a portion of third light 180 emitted from the second LED 120 enters the second phosphor 125 and is not down-converted by phosphor 125. The unconverted third light 184 has the same range of wavelengths as third light 180. The unconverted third light 184 enters the first phosphor 115 from the second phosphor 125. Upon entering the first phosphor 115, a portion of the unconverted third light 184 may remain unconverted. In such case any unconverted third light 184 not further converted by the first phosphor 115 exits the light emitting surface having the same range of wavelengths as the second light 180. Depending on the wavelength range of third light 180 and the characteristics of the first phosphor, unconverted third light 184, or a portion thereof, may be absorbed by first phosphor 115, and down-converted to light 188 having longer wavelengths than unconverted third light 184, and which may have a same range of wavelengths as second light 172.

The second light 172, unconverted first light 174, fourth light 182, and any unconverted third light 184 and light 188, combine to form the desired color or white light CCT value of the lighting device 100. The second light 172, unconverted first light 174, fourth light 182, as well as any unconverted third light 184 and light 188, pass through at least a portion of the first phosphor 115 and through the light emitting surface 140, which gives lighting device 100 the appearance of a uniform color of light, due to the scattering properties of the first phosphor 115 and because the light is emitted through the single surface of uniform material, instead of through discrete LED packages. All of the light that leaves the lighting device 100 passes through some portion of the first phosphor 115 and through the uniform light emitting surface 140.

First phosphor 115 and second phosphor 125 may be arranged to convert different amounts of first light 170 and third light 180. Second phosphor 125 may be arranged such that most or all of the third light 180 is down-converted by the second phosphor 125, and none of, or only a small portion of third light 180 is not down-converted by second phosphor 125. That is, little or no unconverted third light 184 enters the first phosphor 115. For example, the second phosphor 125 may convert more than 90% of third light 180 to fourth light 182, and 10% or less of third light 180 may enter the first phosphor 115 as unconverted third light 184. For example, second phosphor may convert more than 97% of third light 180 to fourth light 182, and 3% or less of third light 180 may enter the first phosphor 115 as unconverted third light 184. Increasing the amount of conversion of third light 180 reduces the effect of the first phosphor 115 on the color points, so that the first phosphor 115 mostly causes scattering of fourth light 182.

This difference in conversion between the first phosphor 115 and second phosphor 125 can be observed in the light output by lighting device 100. The "first primary" of lighting device 100 is defined as light emitted by first LED 110 that passes through first phosphor 115 and exits lighting device 100 through light emitting surface 140, (that is, second light 172 and unconverted second light 174). The "second primary" of lighting device 100 is defined as light from the second LED 120 that passes through the second phosphor 125 and then first phosphor 115, and exits lighting device 100 through the light emitting surface 140, (that is fourth light 182 and any unconverted third light 186 and light 188 that exits the lighting device 100). If the first light 170 emitted by the first LED 110 has a first wavelength range, the spectral power distribution of the second primary may contain less than 3% of the total radiant power within the wavelength ranges of the unconverted second light 174 (i.e., within the first wavelength range). The spectral power distribution of the first primary, may have at least 25% of total radiant power within the wavelength ranges of the unconverted second light 174 (i.e., within the first wavelength range). The second phosphor 125 is arranged so that this difference in spectral power distribution between the first and second primaries remains even when the second LED 120 is configured to emit light in the first wavelength range, i.e., within the same wavelength range as the first LED 110.

Any appropriate method may be used to form first phosphor 115 and second phosphor 125. For example, first phosphor 115 may be formed by mixing a first phosphor material into a carrier material, such as silicone, to form a silicone slurry. Second phosphor 125 may be formed separately by mixing a second phosphor material into a carrier material, such as a silicone, to also form a silicone slurry. The second phosphor 125 mixture of the second phosphor material and carrier is deposited over the second LED 120 mounted on mounting frame 150 to form second phosphor 125. The second phosphor 125 mixture of the second phosphor material and carrier is deposited in such a way that it is contained over and around the second LED 120 (methods for containment of the second phosphor are described in more detail below with respect to FIG. 2 and FIG. 4). After the second phosphor 125 mixture is deposited, the first phosphor 115 mixture is deposited over the first LED 110 mounted on mounting surface 150, the second phosphor 125 and the second LED 120.

In another example method for forming first phosphor 115 and second phosphor 125, the carrier is a ceramic, and the phosphor material is mixed into the ceramic and formed into a ceramic platelet. The ceramic platelet of the second phosphor 125 is sized to cover the second LED 120, and is then positioned on the second LED 120, but not the first LED 110. The ceramic platelet of the first phosphor 115 is sized to cover both the first LED 110 and the second LED 120, and is positioned over the first LED 110, the second phosphor 125 ceramic plate, and the second LED 120, such that the second phosphor 125 ceramic plate is positioned between the second LED 120 and the first phosphor 115 ceramic plate. If the first phosphor 115 and second phosphor 125 are formed as ceramic platelets, they may or may not be formed so as to also be positioned between first LED 110 and second LED 120, but the two LEDs may instead be separated by an optical barrier, so the that ceramic platelets are positioned only on the top of the LEDs.

A person having ordinary skill in the art will understand how to achieve the difference in conversion between the first phosphor 115 and second phosphor 125 described above. For example, the first phosphor 115 may have a lower concentration of phosphor material than the second phosphor 125, which concentration of phosphor material will depend on the particular phosphor material used. The size of the phosphor particle in the phosphor material used can also be used to adjust the extent of conversion.

The first phosphor 115 may also include a scattering agent, for example scattering particles such as $TiO_2$ or $ZrO_2$ to enhance the scattering performance of the first phosphor 115 and further increase the uniformity of light.

Any LED may be used as first LED 110 and second LED 120 depending on the desired color or white light CCT, and if applicable, the desired tuning range, of the lighting device 100. For instance, first LED 110 and second LED 120 may be semiconductor diodes structures, or LED dies, such as III-nitride LEDs based on the InGaN materials system. First LED 110 and second LED 120 may be the same, emitting first light 170 and third light 180 having the same wavelength range, or first LED 110 and second LED 120 may be different, and first light 170 may have a different wavelength range than third light 180.

The particular LEDs and particular phosphor materials chosen for use in lighting device 100 are selected to provide the desired color or white light CCT value of the lighting device, or range of colors and white light CCTs of lighting device 100 if lighting device 100 is tunable.

The lighting device 100 may configured to be tunable by varying the driving current provided to the first LED 110 and second LED 120, such that the color or white light CCT value varies as more or less first light 170 and third light 180 are emitted. Because all light emitted from the lighting device 100 is emitted through the light emitting surface 140, the light has a uniform appearance even as the different primaries are mixed to form different colors or white light CCT values.

Lighting devices as disclosed herein may be useful for producing a tunable white light lighting device having a uniform appearance. Such a lighting device may be made, for example, in a single LED package (a single lead frame) with three phosphor-converted colors that serve as the primaries for the color-tunable lighting device.

Figure 2:
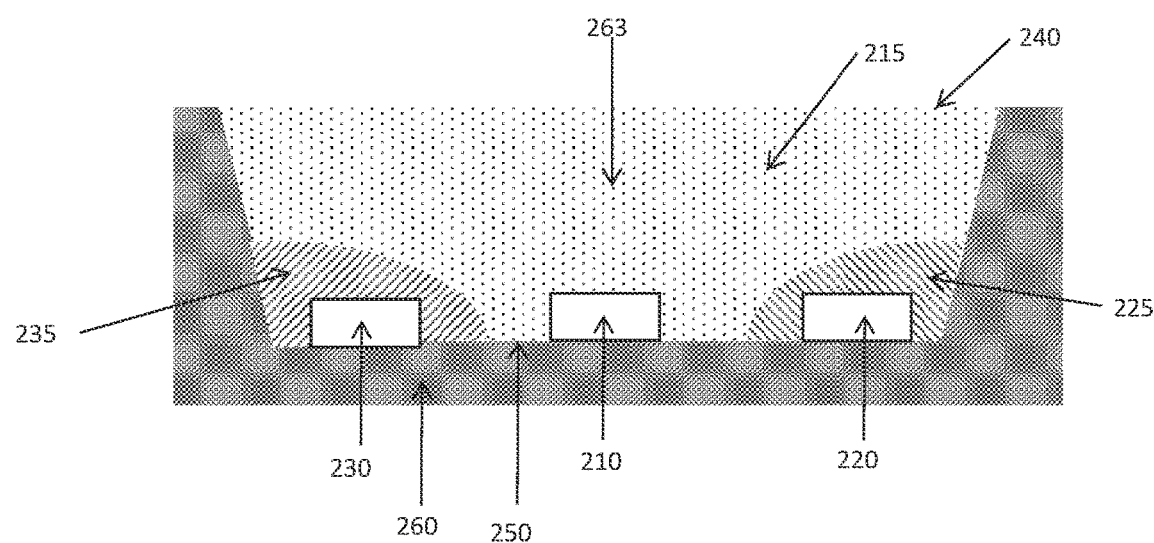
FIG. 2 is a cross-sectional view illustrating a lighting device according to another example embodiment.

FIG. 2 illustrates a lighting device 200 useful for producing white light lighting devices in a single LED package, including white light lighting devices in a single LED package that are tunable between varying white light CCT values. The lead frame 260 contains first LED 210, second LED 220 and third LED 230 disposed on mounting surface 250. Second phosphor 225 is disposed over second LED 220. Third phosphor 235 is disposed over third LED 230. The first phosphor 215 is disposed over the first LED 210, the second phosphor 225 and second LED 210, and the third phosphor 235 and third LED 230. The first phosphor 215 is disposed between the first LED 210 and the second LED 220, as well as between the first LED 210 and the third LED 230. The second phosphor 225 is disposed between the first phosphor 215 and the second LED 220. The third phosphor 235 is disposed between the first phosphor 215 and the first LED 210.

The first phosphor 215 covers the entire surface of the lead frame 260 LED package, to form the light emitting surface 240, which creates a uniform appearance of the light due to the scattering properties of the first phosphor 215, as described above with respect to FIGS. 1A and 1B.

Similar to the second LED 120 and second phosphor in FIG. 1B, the third LED 230 is configured to emit light, a fifth light, which is absorbed, or mostly absorbed, by third phosphor 235 and down-converted to a sixth light having longer wavelengths than the fifth light. The sixth light exits the third phosphor 235 and enters and passes through the first phosphor 215. The light emitted by the lighting device 200 through the light emitting surface 240 includes the sixth light, in addition to light emitted and down converted from the first LED 210 and first phosphor 215, and second LED 220 and second phosphor 225, and any unconverted light, as described above with respect to FIG. 1B.

Figure 3:
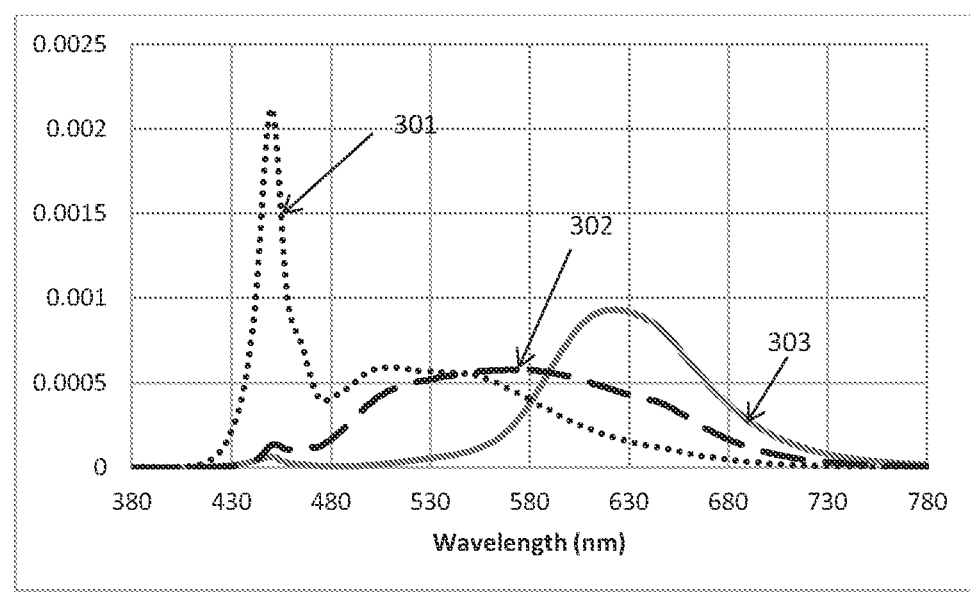
FIG. 3 shows a blue, green, and red primary spectra for a lighting device according to yet another example embodiment.

The first LED 210, second LED 220, third LED 230, first phosphor 215, second phosphor 225, and third phosphor 235 may be selected to produce white light with a tunable CCT. For example, reference is made to U.S. patent application Ser. No. 16/431,094, titled "LED and Phosphor Combinations for High Luminous Efficacy Lighting with Superior Color Control," for a detailed description of white light tuning with desaturated RGB primaries (incorporated herein by reference). The first LED 210, second LED 220, and third LED 230 may be LED dies configured to emit violet or blue light with a peak wavelength in the range of 400-460 nm. The phosphor mixtures may have different compositions of green and/or red phosphors. In particular, for example, second phosphor 225 may include a red phosphor material, and third phosphor 235 may include a green phosphor material. The first phosphor 115 may also include a green phosphor material, but at a low enough concentration that the combination of the unconverted first light emitted by LED 210, and second light converted by the first phosphor 215 is substantially blue, that is, has a peak wavelength in the range of 400-460 nm (as shown, for example, in FIG. 3 described below). The light emitted by each LED die 210, 220, and 230 is at least partly down-converted by the respective phosphors 215, 225, 235 to longer wavelengths; thus, three primary spectra are formed. For example, the three primary spectra for such a white light lighting device 200 may have substantially blue, red, and green color points and other spectral characteristics described in more detail in U.S. patent application Ser. No. 16/431,094. FIG. 3 shows example primary spectra of blue 301, red, 302, and green 303. The red and green primaries, those emitted from second LED 220 through the second phosphor 225, and third LED 230 through third phosphor 235, are almost fully converted. Therefore, having the light from those primaries pass through the first phosphor 215 of the blue primary has very little effect on the red and green primary color points and results mostly in scattering. This property is utilized in the embodiments of this disclosure by having the first phosphor 215 cover the entire light emitting surface 240 of the LED package 260, to create a uniform source appearance.

As described above, the light from first LED 210 that passes through the first phosphor 115 that forms the light emitting surface 240 is less converted than that from the second and third LEDs 220, 230 underneath the first phosphor 215 and, respectively, the second phosphor 225 and third phosphor 235. Preferably, primary spectra of the light emitted by the second LED 220 and third LED 230 and having passed through the second phosphor 225 and third phosphor 235, respectively, and the first phosphor 215 to exit the lighting device 200 through the light emitting surface 240 have a spectral power distribution that contains less than 3% of total radiant power in the wavelength range of 400-460 nm of the LED dies used for the first, second and third LEDs 210, 220, and 230, and the primary spectra of the light emitted by the first LED 210 and having passed through the first phosphor 215 to exit the lighting device 200 through the light emitting surface 240 has a spectral power distribution with more than 25% of total radiant power in this wavelength range (400-460 nm).

Lighting device 200 may be formed by forming three mixtures of phosphor materials dispensed in a silicone carrier to form a silicone slurry, one for each of the first, second, and third phosphor 215, 225, and 235, respectively. The second phosphor 225 mixture and third phosphor 235 mixture, which are the red and green phosphor silicone slurries, respectively, are deposited on top of the respective LED dies, 220, 230, and are contained over and around the respective LED dies 220, 230 due to surface tension and viscosity of the silicon slurry. After being deposited on the respective LED dies, 220, 230, the red phosphor and green phosphor silicone slurries may be partially or fully cured to preserve the shape of the deposited phosphor silicone slurry and to also help contain the phosphor silicone slurries over the respective LEDs. The mixture of the first phosphor material dispensed in a silicon slurry is then deposited over the first LED 210, and the second and third phosphors 225 and 235, and fills the cavity 263 of the lead frame 260 LED package.

Figure 4A:
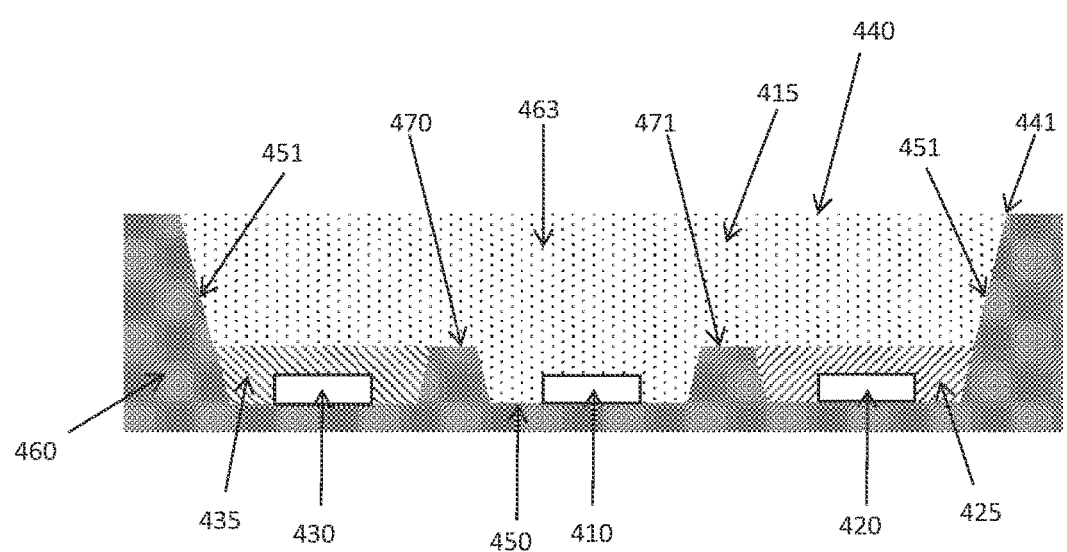
FIG. 4A and FIG. 4B are, respectively, a cross-sectional view and a plan view illustrating a lighting device according to yet another embodiment. The cross-sectional view in FIG. 4A is taken through line I-I' shown in FIG. 4B.
Figure 4B:
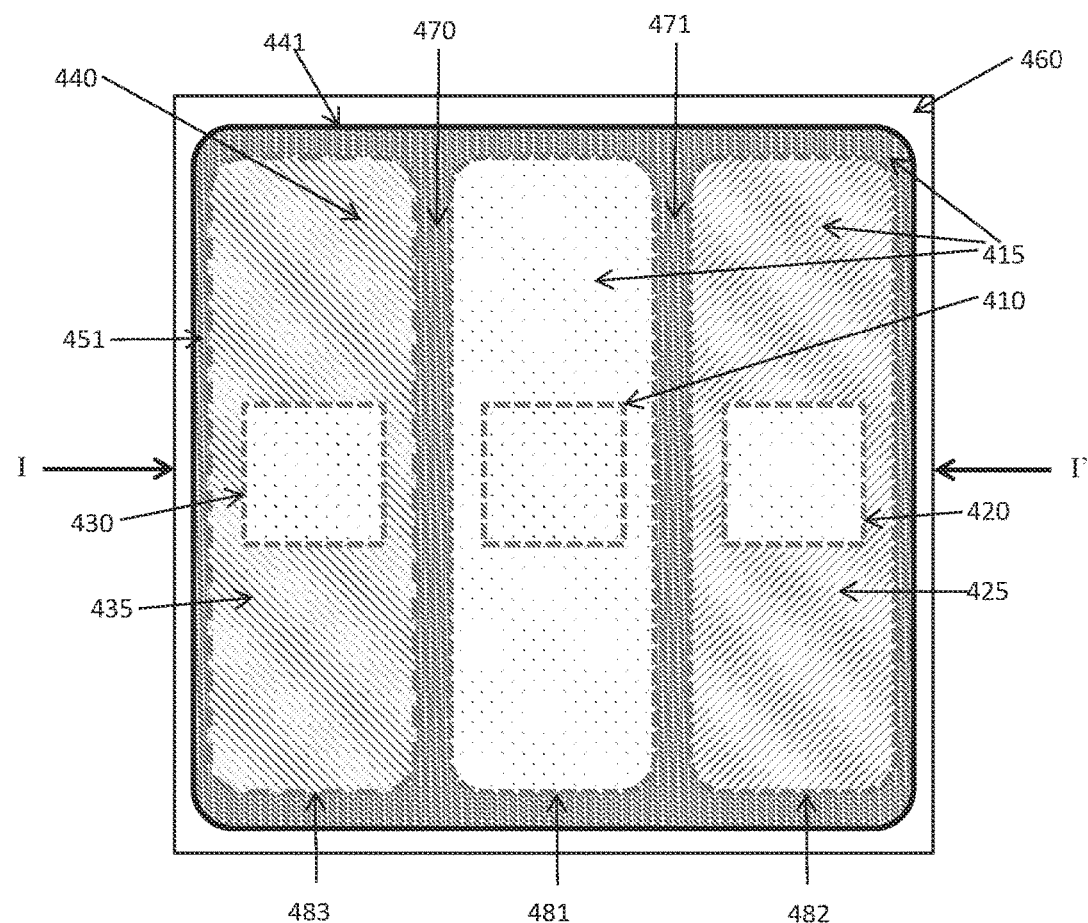

FIGS. 4A and 4B illustrate, respectively, a cross-sectional view and a plan view of a lighting device 400 which utilizes an alternative method for containing the separate phosphors. In lighting device 400, the mounting surface 450 of lead package 460 is shaped to include inner walls (or dams) 470, 471 inside the main cavity 463 of the lead frame 460 LED package. The first LED 410 is disposed on the mounting surface 450 of the lead package 460 between two the inner walls 470, 471. The second LED 420 is disposed on mounting surface 450 between inner wall 471 and the sidewall 451 of lead frame 460. The third LED 430 is disposed on mounting surface 450 between inner wall 470 and sidewall 451 of lead frame 460. A mixture of the second phosphor material and silicone slurry used to form second phosphor 425 is deposited over the second LED 420 and between the inner wall 471 and sidewall 451, such that the mixture is contained by the inner wall 471 and sidewall 451. Similarly, a mixture of the third phosphor material and carrier, such as a silicone slurry, used to form the third phosphor 435 is deposited over the third LED 430 and between inner wall 470 and sidewall 451, such that the mixture is contained between inner wall 470 and sidewall 451. A mixture of the first phosphor material and carrier, such as a silicon slurry, used to form the first phosphor 415 is then deposited over the first LED 410 to fill the cavity 463 between sidewalls 451, covering the second phosphor 425 and third phosphor 435, and forming light emitting surface 440.

FIG. 4B illustrates a plan view of lighting device 400. The lead frame 460 is rectangular. The inner walls 470, 471 divide the cavity 463 into three rectangular wells 481, 482, and 483 which contain, respectively, the first LED 410, second LED 420, and third LED 430. Second phosphor 425 is disposed within second well 482 and third phosphor 435 is contained within third well 483. First phosphor 415 fills the first well 481 and the remainder of the cavity, forming the light emitting surface 440 within light emitting surface edge 441.

Figure 5:
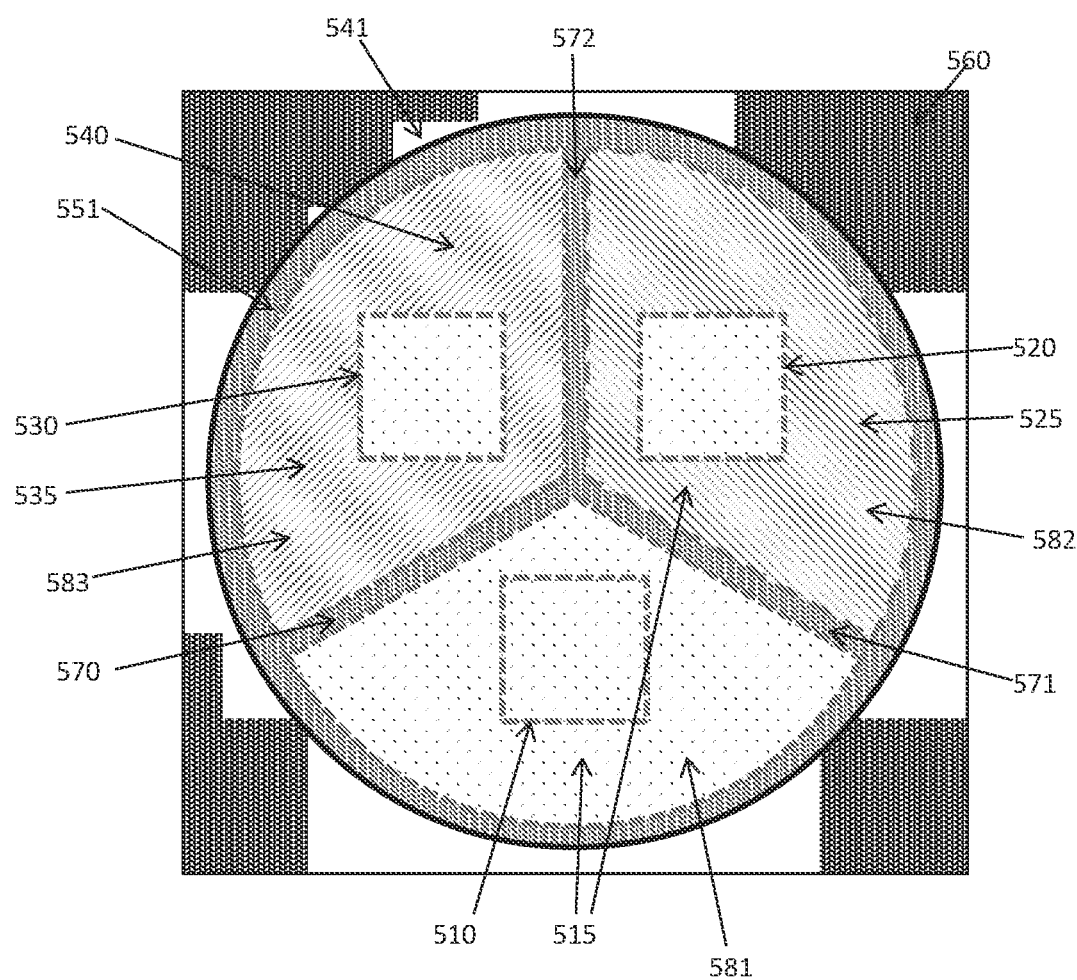
FIG. 5 is a cross-sectional view illustrating a lighting device according to yet another example embodiment.

Lighting devices according to the disclosure may have a variety of different geometries. FIG. 5 illustrates a lighting device 500 having a circular geometry. In lighting device 500 there are three inner walls 570, 571, and 572. The three inner walls 570, 571, and 572 divide the circular cavity 563 in lead frame 560 into three wells, 581, 582, and 583 which contain, respectively, the first LED 510, second LED 520, and third LED 530. The three wells 581, 582, and 583 are shown in FIG. 5 as having approximately equal volume, however, any suitable relationship of volumes may be used. Two inner walls 570 and 572, along with the sidewall 551 of lead frame 560 contain the third phosphor 235. Two inner walls 572 and 571, along with the sidewall 551 of the lead frame 560 contain the second phosphor 225.

In addition to providing a uniform light source, another advantage of the lighting device disclosed herein, is that it allows all of the primaries to be contained within a single LED package, which reduces the size of the device as compared to using multiple LED packages, and also simplifies the use of the device. For instance, a three primary conventional white light source would need three individual LED packages, one for red, green, and blue, which may be 3.5 mm×2.8 mm each. In the lighting devices disclosed herein, for instance lighting devices 400 (FIGS. 4A and 4B) and 500 (FIG. 5), all three primaries are contained in a single LED package which may be 3.0 mm×3.0 mm, which is significantly smaller. The size is further reduced because there is no need for additional optics that are required when the individual LED packages are used for each color to create uniform light.

Although described above in terms of red, green and blue primaries, in other embodiments primaries having different colors, and/or additional primaries may be employed. For example, a fourth LED may be included having a fourth phosphor also situated over the fourth LED and under the first phosphor material may be used. Any number of primaries (>1) may be used.

Other implementations of the lighting device disclosed herein, in addition to the single lead frame LED package disclosed above, may be utilized. For example, each of the first LED, second LED, and third LED may be a group of LEDs, which may be utilized in, for example, a chip-on-board configuration. A chip-on-board configuration may include an array of LED dies, e.g. 36 dies, 96 dies, 450 dies and up, mounted onto a metal-core printed circuit board. In such a chip-on-board configuration which uses three primaries, the group of second LED dies and group of third LED dies are covered by a second and third phosphor, respectively, and the group of first LED dies is covered by a first phosphor which also covers the second and third phosphors and the second and third group of LED dies.

This disclosure is illustrative and not limiting. Further modifications will be apparent to one skilled in the art in light of this disclosure and are intended to fall within the scope of the appended claims.

What is claimed is:
1. A lighting device comprising:
a first LED configured to emit a first light;
a second LED configured to emit a third light;
a third LED configured to emit a fifth light;
a second phosphor disposed over and in contact with the second LED, the second phosphor arranged to absorb a portion of the third light directly from the second LED and in response emit a fourth light of a longer wavelength than the third light, a third phosphor different from the second phosphor disposed over and in contact with the third LED, the third phosphor arranged to absorb a portion of the fifth light directly from the third LED and in response emit a sixth light of a longer wavelength than the fifth light, and a first phosphor disposed over the first LED, the second LED, the third LED, the second phosphor, and the third phosphor, the first phosphor is in contact with the first LED, the first phosphor arranged to absorb a portion of the first light directly from the first LED and in response emit a second light of a longer wavelength than the first light, the fourth light exits the second phosphor directly into the first phosphor, the sixth light exits the third phosphor directly into the first phosphor, the first phosphor comprising a light emitting surface opposite the first, second and third LEDs through which light exits the lighting device.

2. The lighting device of claim 1, wherein the second phosphor comprises red phosphor material and the third phosphor comprises green phosphor material.

3. The lighting device of claim 1, wherein the second light is blue light.

4. The lighting device of claim 1, wherein the portion of the third light absorbed by the second phosphor comprises at least 90% of the third light emitted from the second LED.

5. The lighting device of claim 1, wherein the portion of the fifth light absorbed by the third phosphor comprises at least 90% of the fifth light emitted from the third LED.

6. The lighting device of claim 1, wherein each of the first light, the third light, and the fifth light is blue light having a wavelength range of 400-460 nm.

7. The lighting device of claim 1, wherein substantially all of the first light and third light that exits the lighting device passes through the first phosphor.

8. The lighting device of claim 1, comprising a lead frame having a mounting surface surrounded by side walls, wherein the first LED, the second LED, and the third LED are mounted on the mounting surface, and the light emitting surface of the first phosphor is opposite the mounting surface.

9. The lighting device of claim 8, wherein the lead frame comprises a cavity within which the first LED, the second LED, and the third LED are mounted and the mounting surface comprises two or more inner walls inside the cavity.

10. The lighting device of claim 9, wherein the first LED is mounted between two inner walls inside the cavity.

11. The lighting device of claim 9, wherein the second LED is mounted between an inner wall and a sidewall of the lead frame.

12. The lighting device of claim 9, wherein the lead frame has a rectangular shape and the inner walls divide the cavity into rectangular wells.

13. The lighting device of claim 9, wherein the lead frame has a circular shape and the inner walls are located along radii of the circular shape.

* * * * *